US 11,509,080 B2

(12) United States Patent
Consoli et al.

(10) Patent No.: US 11,509,080 B2
(45) Date of Patent: Nov. 22, 2022

(54) ELECTRICAL CONNECTOR ASSEMBLY HAVING HYBRID CONDUCTIVE POLYMER CONTACTS

(71) Applicant: TE Connectivity Services GmbH, Schaffhausen (CH)

(72) Inventors: John Joseph Consoli, Harrisburg, PA (US); Chad William Morgan, Carneys Point, NJ (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 0 days.

(21) Appl. No.: 16/935,529

(22) Filed: Jul. 22, 2020

(65) Prior Publication Data

US 2022/0029325 A1    Jan. 27, 2022

(51) Int. Cl.
| | | |
|---|---|---|
| H01R 12/00 | (2006.01) | |
| H01R 12/71 | (2011.01) | |
| H01R 12/52 | (2011.01) | |
| H05K 7/10 | (2006.01) | |
| H01R 13/24 | (2006.01) | |

(52) U.S. Cl.
CPC ........... *H01R 12/714* (2013.01); *H01R 12/52* (2013.01); *H01R 12/716* (2013.01); *H01R 13/24* (2013.01); *H05K 7/1061* (2013.01); *H05K 2201/10378* (2013.01); *H05K 2201/10621* (2013.01)

(58) Field of Classification Search
CPC .... H01R 12/714; H01R 12/52; H01R 12/716; H01R 13/24; H05K 7/1061; H05K 2201/10378; H05K 2201/10621
See application file for complete search history.

(56) References Cited

U.S. PATENT DOCUMENTS

| | | | |
|---|---|---|---|
| 5,527,591 A | 6/1996 | Crotzer et al. | |
| 5,599,193 A * | 2/1997 | Crotzer | H01L 23/49827 257/E23.067 |
| 5,600,099 A | 2/1997 | Crotzer et al. | |
| 5,766,021 A * | 6/1998 | Pickles | H05K 7/1084 439/264 |
| 5,871,842 A | 2/1999 | Crotzer et al. | |
| 5,949,029 A | 9/1999 | Crotzer et al. | |
| 6,345,989 B1 | 2/2002 | Mason et al. | |

(Continued)

FOREIGN PATENT DOCUMENTS

| | | |
|---|---|---|
| KR | 101393601 B1 | 5/2014 |
| KR | 101959536 B1 | 3/2019 |
| KR | 102113732 | 5/2020 |

*Primary Examiner* — Abdullah A Riyami
*Assistant Examiner* — Nelson R. Burgos-Guntin

(57) ABSTRACT

An electrical connector assembly includes a carrier having an upper surface and a lower surface. The carrier includes a plurality of contact openings therethrough. The electrical connector assembly includes contacts coupled to the carrier and passing through the corresponding contact openings. Each contact has a conductive polymer column extending between an upper mating interface and a lower mating interface. The conductive polymer column includes an inner core manufactured from a first material and an outer shell manufactured from a second material. The second material has a higher electrical conductivity than the first material. The first material has a lower compression set than the second material.

20 Claims, 4 Drawing Sheets

(56) References Cited

U.S. PATENT DOCUMENTS

| | | | |
|---|---|---|---|
| 6,790,057 B2 * | 9/2004 | DelPrete | H01R 12/52 439/66 |
| 6,796,810 B2 * | 9/2004 | DelPrete | H01R 13/2414 439/66 |
| 7,391,227 B2 | 6/2008 | Inoue et al. | |
| 7,393,471 B2 | 7/2008 | Inoue et al. | |
| 7,448,883 B2 * | 11/2008 | Alden, III | H05K 7/1061 439/91 |
| 7,549,870 B2 * | 6/2009 | Mason | H01R 12/52 439/66 |
| 7,585,173 B2 * | 9/2009 | Hilty | H01R 13/2414 439/66 |
| 7,686,624 B2 * | 3/2010 | Mason | H01R 12/7076 439/91 |
| 7,722,360 B2 * | 5/2010 | Millard | H01R 13/6585 439/66 |
| 7,726,976 B2 * | 6/2010 | Mason | H05K 7/1061 439/66 |
| 7,726,984 B2 * | 6/2010 | Bumb, Jr. | H01R 4/26 439/91 |
| 7,821,283 B2 | 10/2010 | Yamada et al. | |
| 7,878,818 B2 * | 2/2011 | Cheng | H01R 13/2435 439/66 |
| 8,172,623 B1 | 5/2012 | Zhu | |
| 8,202,100 B2 | 6/2012 | Luo | |
| 8,282,431 B1 | 10/2012 | Zhang | |
| 8,366,453 B2 | 2/2013 | Chang et al. | |
| 8,926,343 B2 * | 1/2015 | Mason | H05K 7/1053 439/91 |
| 2008/0188127 A1 * | 8/2008 | Alden | H01R 13/2414 439/607.05 |
| 2008/0242128 A1 * | 10/2008 | Hilty | H01R 13/2414 439/91 |
| 2009/0088005 A1 * | 4/2009 | Mason | H01R 13/2414 439/66 |
| 2010/0291774 A1 * | 11/2010 | Cheng | H01R 13/2435 439/66 |
| 2014/0141632 A1 * | 5/2014 | Mason | H01R 13/2414 439/91 |
| 2020/0150148 A1 * | 5/2020 | Chung | H05K 7/1023 |

* cited by examiner

ELECTRICAL CONNECTOR ASSEMBLY HAVING HYBRID CONDUCTIVE POLYMER CONTACTS

BACKGROUND OF THE INVENTION

The subject matter herein relates generally to electrical connector assemblies.

The ongoing trend toward smaller, lighter, and higher performance electrical components and higher density electrical circuits has led to the development of surface mount technology in the design of printed circuit boards and electronic packages. Surface mountable packaging allows for a separable connection of an electronic package, such as an integrated circuit or a computer processor, to pads on the surface of the circuit board rather than by contacts or pins soldered in plated holes going through the circuit board. Surface mount technology may allow for an increased component density on a circuit board, thereby saving space on the circuit board.

One form of surface mount technology includes socket connectors. A socket connector may include a substrate holding an array of contacts. Some known socket connectors have an array of conductive polymer columns that are compressible to provide an interposer between the host circuit board and the electronic package. However, known socket connectors have a low deflection and working range. Conductive polymers may exhibit stress relaxation over time as the loading material disrupts and adversely affects the crosslinking of the polymer material. The material of the conductive polymer may experience permanent set or creep over time causing the socket connector to have a potentially limited working lifespan and the inability to be reused.

A need remains for an electrical connector assembly having improved contacts with an extended working lifespan.

BRIEF DESCRIPTION OF THE INVENTION

In an embodiment, an electrical connector assembly is provided. The electrical connector assembly includes a carrier having an upper surface and a lower surface. The lower surface is configured to face a host circuit board. The upper surface is configured to face a component circuit board of an electrical component. The carrier includes a plurality of contact openings therethrough. The electrical connector assembly includes contacts coupled to the carrier and passing through the corresponding contact openings. Each contact has a conductive polymer column extending between an upper mating interface and a lower mating interface, the conductive polymer column being compressible between the upper mating interface and the lower mating interface. The conductive polymer column includes an inner core and an outer shell. The inner core is manufactured from a first material. The outer shell is manufactured from a second material. The second material has a higher electrical conductivity than the first material. The first material has a lower compression set than the second material.

In another embodiment, an electrical connector assembly is provided. The electrical connector assembly includes a carrier having an upper surface and a lower surface. The lower surface is configured to face a host circuit board. The upper surface is configured to face a component circuit board of an electrical component. The carrier includes a plurality of contact openings therethrough. The electrical connector assembly includes contacts coupled to the carrier and passing through the corresponding contact openings. Each contact has a conductive polymer column extending between an upper mating interface and a lower mating interface the conductive polymer column is compressible between the upper mating interface and the lower mating interface. The conductive polymer column includes an inner core and an outer shell. The inner core is secured to the carrier by a first molding. The outer shell is secured to the carrier by a second molding over the first molding.

In a further embodiment, an electrical system is provided. The electrical system includes a host circuit board. The system includes an electrical component having a component circuit board. The system includes an electrical connector assembly electrically connected between the host circuit board and the component circuit board. The electrical connector assembly includes a support frame having a frame opening. The frame opening receives the component circuit board. The support frame positions the component circuit board within the frame opening. The electrical connector assembly includes a carrier coupled to the support frame. The carrier has an upper surface and a lower surface. The lower surface faces the host circuit board. The upper surface faces the component circuit board. The carrier includes a plurality of contact openings therethrough. The electrical connector assembly includes contacts coupled to the carrier and passing through the corresponding contact openings. Each contact has a conductive polymer column extending between an upper mating interface and a lower mating interface. The upper mating interface is electrically coupled to the component circuit board. The lower mating interface is electrically coupled to the host circuit board. The conductive polymer column is compressible between the upper mating interface and the lower mating interface. The conductive polymer column includes an inner core and an outer shell. The inner core is manufactured from a first material. The outer shell is manufactured from a second material. The second material has a higher electrical conductivity than the first material. The first material has a lower compression set than the second material.

DETAILED DESCRIPTION OF THE INVENTION

Figure 1:
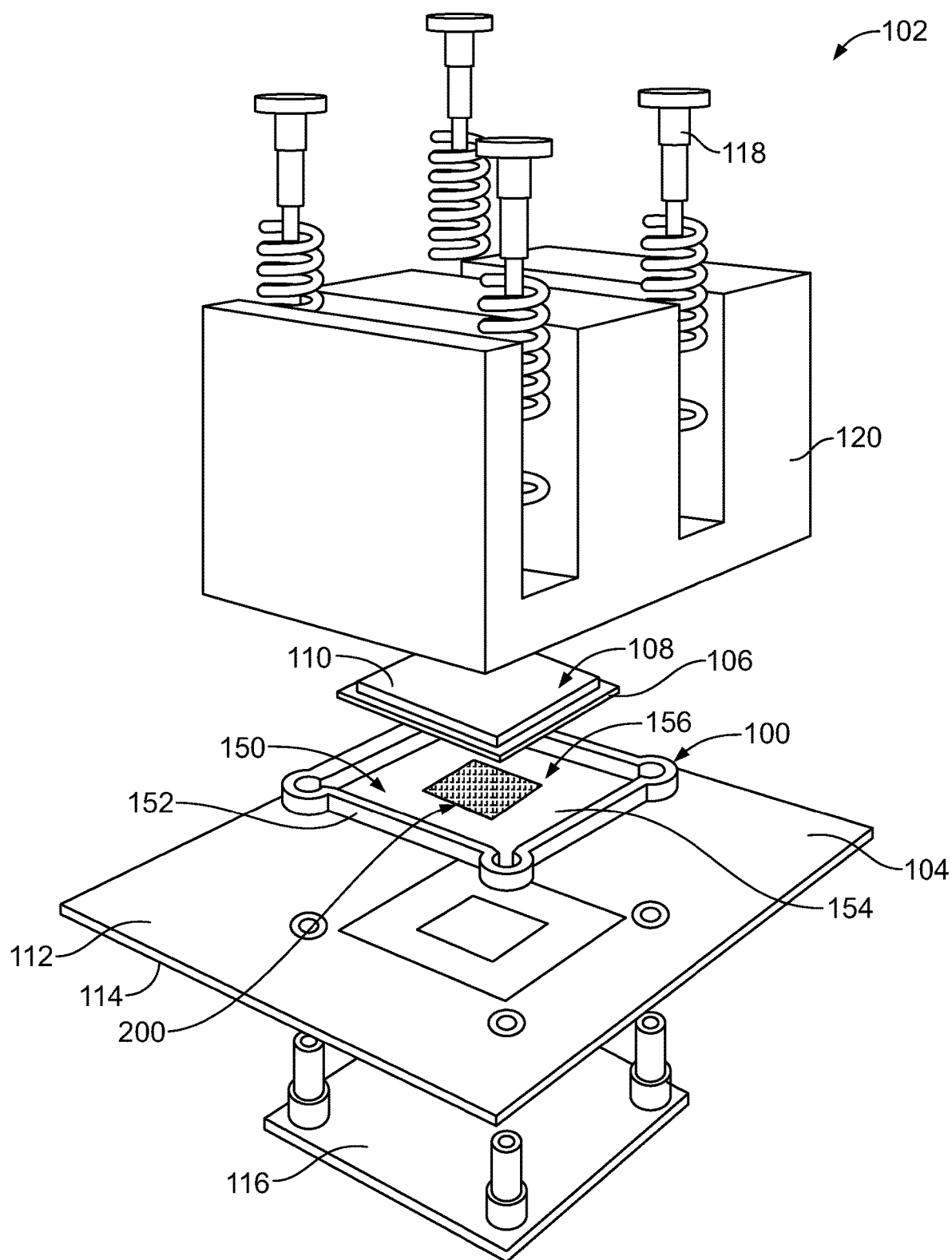
FIG. 1 is an exploded view of an electrical connector assembly in accordance with an exemplary embodiment for an electrical system.
Figure 2:
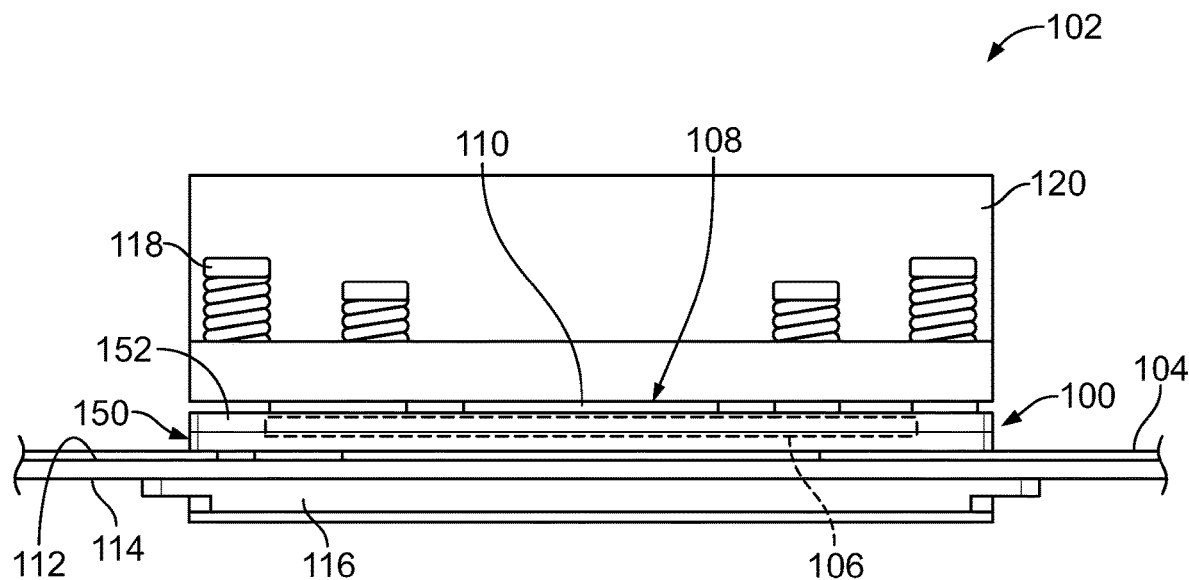
FIG. 2 is a side view of the electrical connector assembly of the electrical system in accordance with an exemplary embodiment.

FIG. 1 is an exploded view of an electrical connector assembly 100 in accordance with an exemplary embodiment for an electrical system 102. FIG. 2 is a side view of the electrical connector assembly 100 of the electrical system 102 in accordance with an exemplary embodiment. The electrical system 102 includes a host circuit board 104 and a component circuit board 106 (shown in phantom) of an electrical component 108. The electrical connector assembly 100 is used to electrically connect the component circuit board 106 with the host circuit board 104. In various embodiments, the electrical component 108 is an electronic package, such as an ASIC. For example, the electrical component 108 may include a chip 110 mounted to the component circuit board 106.

The host circuit board 104 includes an upper surface 112 and a lower surface 114. The electrical connector assembly 100 is mounted to the upper surface 112 of the host circuit board 104. In an exemplary embodiment, a backer plate 116 is provided at the lower surface 114 to stiffen the host circuit board 104. The electrical connector assembly 100 may be coupled to the backer plate 116 through the host circuit board 104, such as using fasteners 118.

In an exemplary embodiment, a thermal plate 120 (FIG. 1) is thermally coupled to the electrical component 108 to dissipate heat from the electrical component 108. For example, the plate 120 may be used to dissipate heat from the chip 110. The thermal plate 120 may be a heatsink or a cold plate in various embodiments. Other types of thermal plates may be used in alternative embodiments. The plate 120 may be coupled to the electrical connector assembly 100 and/or the host circuit board 104 and/or the backer plate 116 in various embodiments.

In an exemplary embodiment, the electrical connector assembly 100 includes a compressible interface for receiving the electrical component 108. The electrical connector assembly 100 is electrically connected to the chip 110 through the component circuit board 106. In an exemplary embodiment, the thermal plate 120 is coupled to the top of the chip 110 to dissipate heat from the chip 110. The backer plate 116 may be used to secure the thermal plate 120 and/or the electrical component 108 and/or the electrical connector assembly 100 to the host circuit board 104.

In an exemplary embodiment, the electrical connector assembly 100 includes an interposer 150 that holds a plurality of contacts 200. In an exemplary embodiment, the contacts 200 are conductive polymer contacts. The contacts 200 may be metallized particle interconnects. The contacts 200 are configured to be electrically connected to the host circuit board 104 and are configured to be electrically connected to the component circuit board 106 to transmit data signals therebetween. The contacts are held in a contact array. In an exemplary embodiment, the array of contacts is configured to be coupled to the component circuit board 106 at a separable interface and configured to be coupled to the host circuit board 104 at a separable interface. For example, the contacts 200 may form a land grid array (LGA) interface with the component circuit board 106 and may form an LGA interface with the host circuit board 104.

In various embodiments, the electrical connector assembly 100 includes a support frame 152 holding the interposer 150 and configured to hold the electrical component 108. The support frame 152 may be a socket frame forming a socket that receives the electrical component 108. The interposer 150 includes a carrier 154 holding the contacts 200. The carrier 154 is coupled to the support frame 152. For example, the support frame 152 may include a socket opening 156 that receives the electrical component 108. The carrier 154 is held in the socket opening 156 for interfacing with the electrical component 108, such as the component circuit board 106. The support frame 152 is used to position the component circuit board 106 relative to the interposer 150 and the contacts 200. The support frame 152 may be secured to the host circuit board 104 and/or the backer plate 116 using fasteners 118. The thermal plate 120 may be coupled to the support frame 152. Optionally, the support frame 152 may position the thermal plate 120 relative to the electrical component 108, such as to limit compression of the thermal plate 120 against the electrical component 108. In alternative embodiments, the interposer 150 may be provided without the support frame 152.

Figure 3:
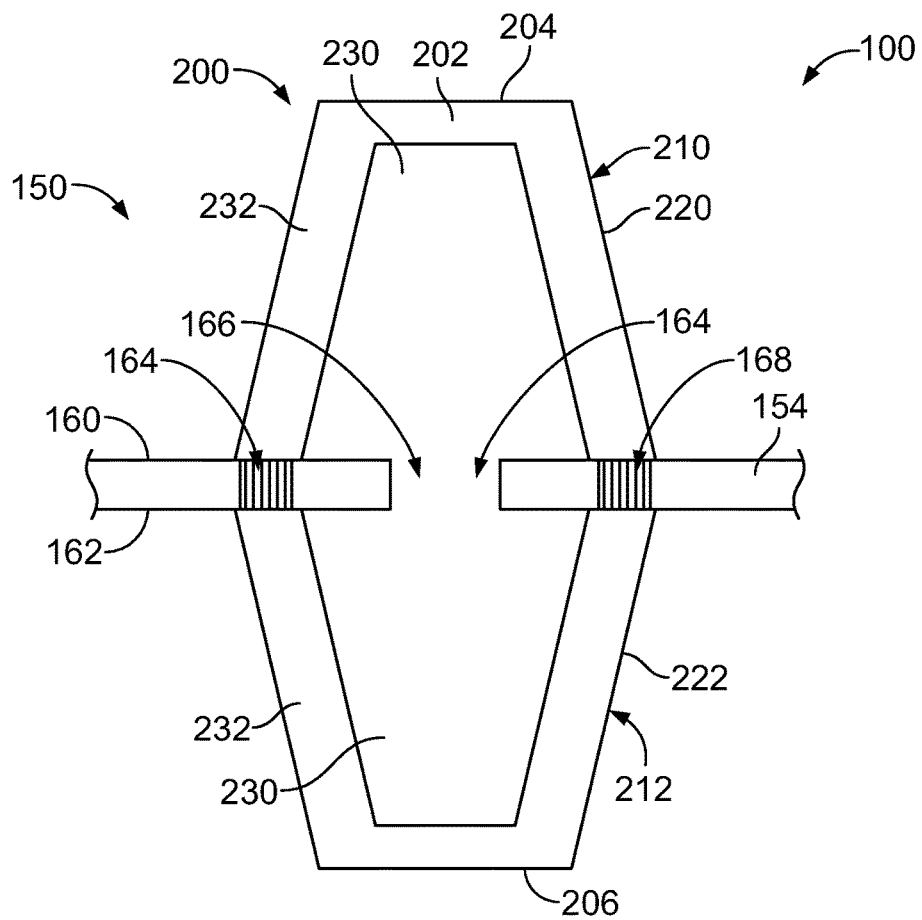
FIG. 3 is a cross-sectional view of a portion of the electrical connector assembly in accordance with an exemplary embodiment showing one of the contacts coupled to a carrier.
Figure 4:
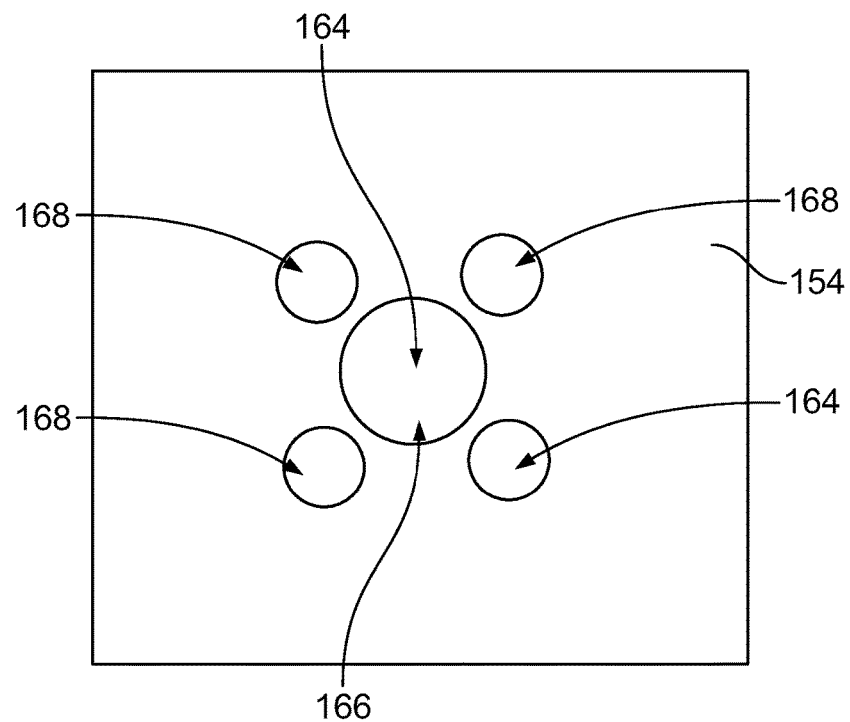
FIG. 4 is a top view of a portion of the electrical connector assembly in accordance with an exemplary embodiment showing the carrier.

FIG. 3 is a cross-sectional view of a portion of the electrical connector assembly 100 in accordance with an exemplary embodiment showing one of the contacts 200 coupled to the carrier 154. FIG. 4 is a top view of a portion of the electrical connector assembly 100 in accordance with an exemplary embodiment showing the carrier 154.

The interposer 150 includes the carrier 154 holding the contacts 200. The carrier 154 may be a plate or film that supports the contacts 200. The carrier 154 is manufactured from a dielectric material to electrically isolate the contacts 200. For example, the carrier 154 may be a polyimide film. The carrier 154 includes an upper surface 160 and a lower surface 162. The carrier 154 includes a plurality of contact openings 164 extending between the upper surface 160 and the lower surface 162. The contact openings 164 receive the contacts 200. In various embodiments, the contacts 200 are molded in situ on the carrier 154. For example, the material of the contacts 200 passes through the contact openings 164 during the molding process to form the contact 200 above the upper surface 160 and below the lower surface 162. In various embodiments, the contacts 200 may be formed by transfer molding, compression molding, injection molding, dispensing, printing, and the like. In an exemplary embodiment, multiple contact openings 164 are provided. For example, the contact openings 164 include primary contact openings 166 and secondary contact openings 168. The primary contact openings 166 receive a first portion of the contact 200 and the secondary contact openings 168 receive a second portion of the contact 200. In the illustrated embodiment, the mounting location for each contact 200 has a single primary contact opening 166 and a plurality of secondary contact openings 168 surrounding the primary contact opening 166.

In an exemplary embodiment, each contact 200 includes a conductive polymer column 202 extending between an upper mating interface 204 at the top of the contact 200 and a lower mating interface 206 at the bottom of the contact 200. The conductive polymer column 202 is compressible between the upper mating interface 204 and the lower mating interface 206. The upper and lower mating interfaces 204, 206 form separable mating interfaces. The upper and lower mating interfaces 204, 206 may form upper and lower LGAs. The conductive polymer column 202 may include a metallized particle interconnect in various embodiments along at least a portion of the conductive polymer column 202. The conductive polymer column 202 may include conductive caps at the upper and lower mating interfaces 204, 206.

In an exemplary embodiment, the conductive polymer column 202 of each contact 200 includes an upper portion 210 above the upper surface 160 of the carrier 154 and a lower portion 212 below the lower surface 162 of the carrier 154. The carrier 154 extends into the contact 200 to support the contact 200. The upper portion 210 extends between the upper surface 160 and the upper mating interface 204. The lower portion 212 extends between the lower surface 162 and the lower mating interface 206. In an exemplary embodiment, the conductive polymer columns 202 are frustoconical shaped. For example, the upper portion 210 is frustoconical shaped and the lower portion 212 is frustoconical shaped. For example, an upper portion wall 220 is tapered between the upper surface 160 and the upper mating interface 204 and a lower portion wall 222 is tapered between the lower surface 162 and the lower mating interface 206. The upper portion 210 has a first upper diameter at the upper surface 160 and a second upper diameter at the upper mating interface 204 less than the first upper diameter. The lower portion 212 has a first lower diameter at the lower surface 162 and a second lower diameter at the lower mating interface 206 less than the first lower diameter.

In an exemplary embodiment, the conductive polymer column 202 includes an inner core 230 and an outer shell 232. The inner core 230 extends through the carrier 154, such as through an inner opening. The portion of the inner core 230 extending through the carrier 154 may be narrowed to fit through the inner opening. The outer shell 232 extends through the carrier 154, such as through outer openings. The portions of the outer shell 232 extending through the carrier 154 may be narrowed to fit through the outer openings. The outer shell 232 fully or partially surrounds the inner core 230. In an exemplary embodiment, the inner core 230 and the outer shell 232 are manufactured from different materials. For example, the inner core 230 is manufactured from a first material, such as a non-conductive polymer material, and the outer shell 232 is manufactured from a second material, such as a conductive polymer material. The second material has a higher electrical conductivity than the first material. For example, the outer shell 232 is manufactured from a polymer material having conductive particles, such as silver particles, embedded in the polymer base material. The outer shell 232 may be internally conductive through the second material of the outer shell 232. The outer shell 232 may additionally or alternatively be plated or coated to be electrically conductive along the exterior surface. The outer shell 232 forms an electrically conductive path between the upper mating interface 204 and the lower mating interface 206.

In an exemplary embodiment, the first material of the inner core 230 has a lower compression set than the second material. The compression set is the amount of permanent deformation remaining after removal of force. The lower compression set of the second material means less permanent deformation of the second material. In other words, the second material has a greater ability to return to shape when the force is removed. In various embodiments, the inner core 230 is manufactured from a non-conductive polymer material, such as a silicone rubber material, such as a heat cured rubber. The inner core 230 is compressible with the outer shell 232 and presses outward against the outer shell 232 when released to return the outer shell 232 to the normal, uncompressed position. The elastic nature of the first material of the inner core 230 reduces permanent set or creep of the conductive polymer column 202 (for example, permanent set or creep of the material of the outer shell 232. The inner core 230 increases the elasticity of the conductive polymer column 202.

In an exemplary embodiment, the inner core 230 is formed in place on the carrier 154 and the outer shell 232 is formed in place on the carrier 154 over the inner core 230. The outer shell 232 may have a uniform thickness covering the inner core 230. The outer shell 232 may completely surround and enclose the inner core 230. For example, the outer shell 232 may cover the sides, the top and the bottom of the inner core 230 such that no portion of the inner core 230 is exposed. In other various embodiments, the outer shell 232 partially covers the inner core 230, such as leaving a portion of the inner core 230 exposed at an exterior of the contact 200. In an exemplary embodiment, the inner core 230 is secured to the carrier 154 by a first molding using a first mold and the outer shell 232 is secured to the carrier 154 by a second molding over the first molding using a second mold. When molding the inner core 230, the first material flows through the primary contact opening 166 to secure the inner core 230 to the carrier 154. The inner core 230 extends above the upper surface 160 and extends below the lower surface 162. When molding the outer shell 232, the second material flows through the secondary contact openings 168 to secure the outer shell 232 to the carrier 154. The upper and lower portions of the outer shell 232 are electrically connected to each other through the carrier 154. The secondary contact openings 168 surround the central primary contact opening 166. The outer shell 232 extends above the upper surface 160 and extends below the lower surface 162.

Figure 5:
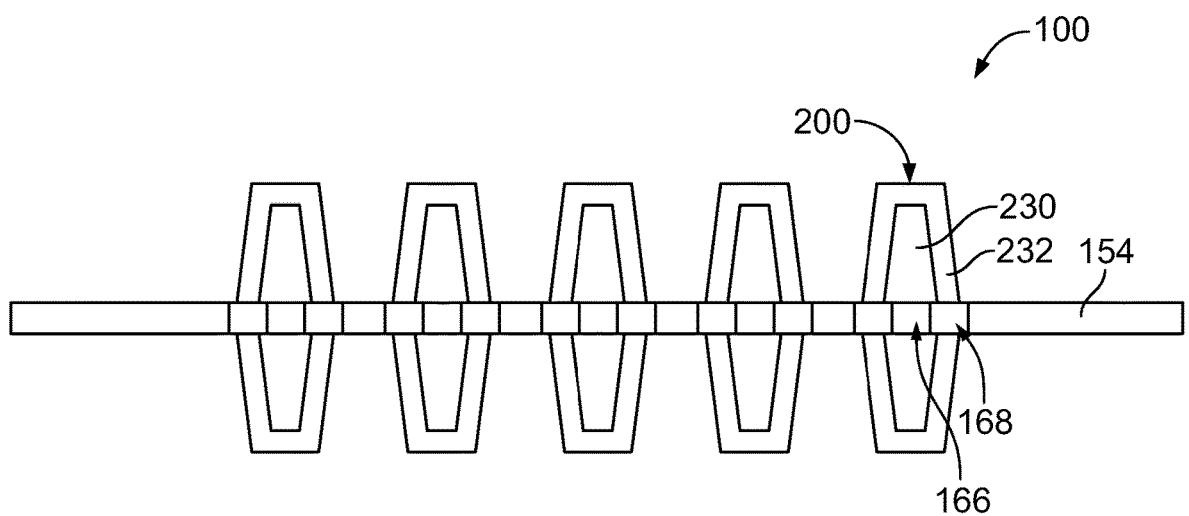
FIG. 5 is a cross-sectional view of a portion of the electrical connector assembly in accordance with an exemplary embodiment showing an array of the contacts coupled to the carrier.
Figure 6:
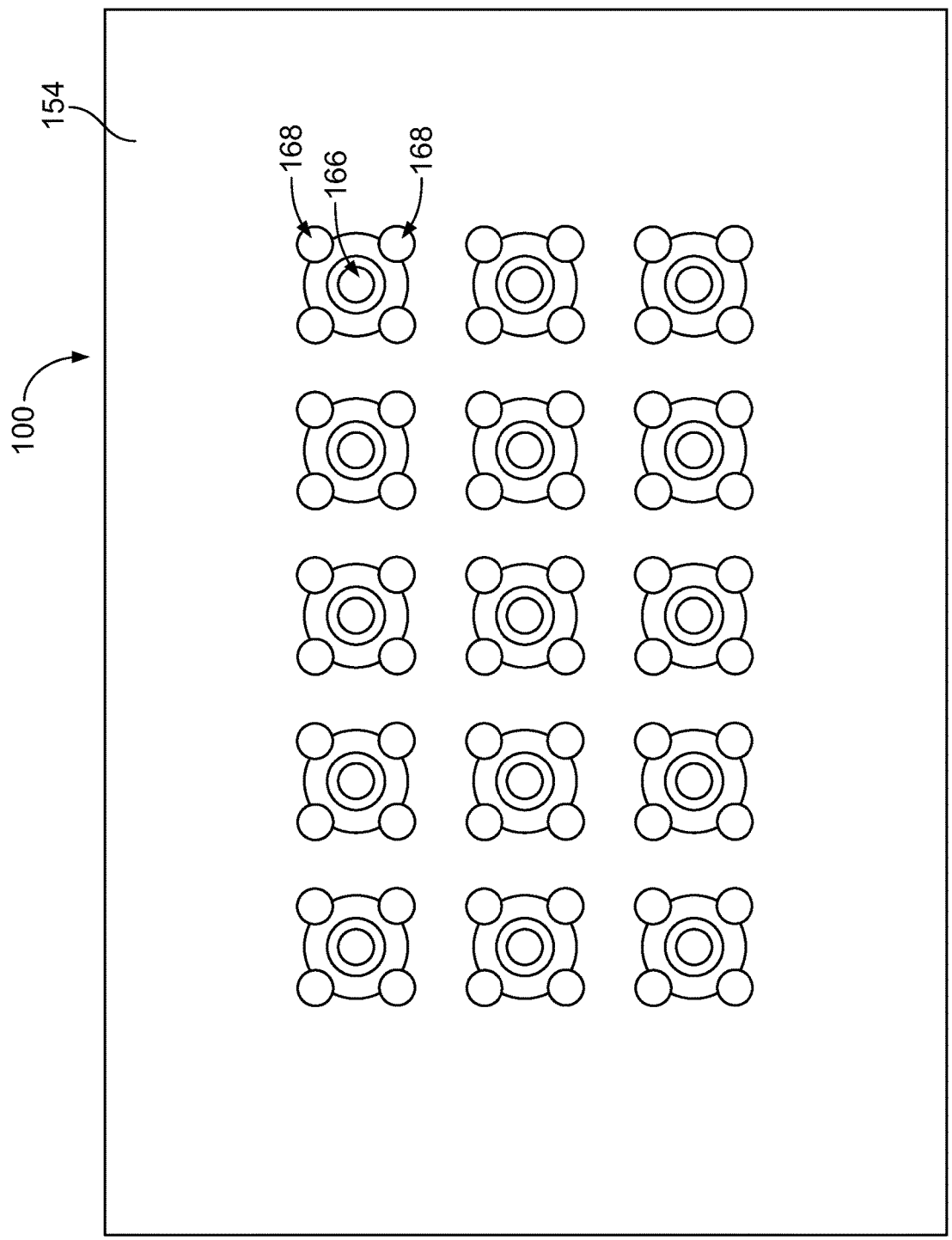
FIG. 6 is a top view of a portion of the electrical connector assembly in accordance with an exemplary embodiment showing a portion of the carrier.

FIG. 5 is a cross-sectional view of a portion of the electrical connector assembly 100 in accordance with an exemplary embodiment showing an array of the contacts 200 coupled to the carrier 154. FIG. 6 is a top view of a portion of the electrical connector assembly 100 in accordance with an exemplary embodiment showing a portion of the carrier 154. In an exemplary embodiment, the inner cores 230 may be formed at the same time using a common mold. The outer shells 232 may then be formed over the inner cores 230 using a common mold. When molding the inner cores 230, the first material flows through the primary contact openings 166. When molding the outer shells 232, the second material flows through the secondary contact openings 168.

The above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:
1. An electrical connector assembly comprising:
a carrier having an upper surface and a lower surface, the lower surface configured to face a host circuit board, the upper surface configured to face a component circuit board of an electrical component, the carrier including a plurality of contact openings therethrough;

contacts coupled to the carrier and passing through the corresponding contact openings, each contact having a conductive polymer column extending between a upper mating interface and a lower mating interface, the conductive polymer column being compressible between the upper mating interface and the lower mating interface, the conductive polymer column including an inner core at an interior of the conductive polymer column and an outer shell at an exterior of the conductive polymer column, the outer shell surrounding and enclosing the inner core, the inner core being manufactured from a first material, the outer shell being manufactured from a second material, the second material having a higher electrical conductivity than the first material, the first material having a lower compression set than the second material.

2. The electrical connector assembly of claim 1, wherein the first material of the inner core is a non-conductive polymer and wherein the second material of the outer shell is a conductive polymer.

3. The electrical connector assembly of claim 1, wherein the outer shell completely surrounds and completely encloses the inner core such that the inner core is not exposed at the exterior of the conductive polymer column.

4. The electrical connector assembly of claim 1, wherein the inner core is formed in place on the carrier and wherein the outer shell is formed in place on the carrier over the inner core.

5. The electrical connector assembly of claim 1, wherein the inner core is secured to the carrier by a first molding and wherein the outer shell is secured to the carrier by a second molding over the first molding.

6. The electrical connector assembly of claim 1, wherein the carrier openings include primary carrier openings and secondary carrier openings, the inner cores passing through the corresponding primary carrier openings, the outer shells passing through the corresponding secondary carrier openings.

7. The electrical connector assembly of claim 6, wherein each outer shell passes through a plurality of the secondary carrier openings.

8. The electrical connector assembly of claim 1, wherein each contact includes an upper portion between the upper surface of the carrier and the upper mating interface and includes a lower portion between the lower surface of the carrier and the lower mating interface, the upper portion being frustoconical shaped, the lower portion being frustoconical shaped.

9. The electrical connector assembly of claim 8, wherein each inner core includes an upper inner portion and a lower inner portion, the upper inner portion being frustoconical shaped, the lower inner portion being frustoconical shaped.

10. The electrical connector assembly of claim 1, wherein the outer shell has a uniform thickness covering the inner core.

11. An electrical connector assembly comprising:

a carrier having an upper surface and a lower surface, the lower surface configured to face a host circuit board, the upper surface configured to face a component circuit board of an electrical component, the carrier including a plurality of contact openings therethrough;

contacts coupled to the carrier and passing through the corresponding contact openings, each contact having a conductive polymer column extending between a upper mating interface and a lower mating interface, the conductive polymer column being compressible between the upper mating interface and the lower mating interface, the conductive polymer column including an inner core at an interior of the conductive polymer column and an outer shell at an exterior of the conductive polymer column, the outer shell surrounding and enclosing the inner core, wherein the inner core is secured to the carrier by a first molding and wherein the outer shell is secured to the carrier by a second molding over the first molding.

12. The electrical connector assembly of claim 11, wherein the inner core is manufactured from a first material and the outer shell is manufactured from a second material, the second material having a higher electrical conductivity than the first material, the first material having a lower compression set than the second material.

13. The electrical connector assembly of claim 11, wherein the inner core is a non-conductive polymer and wherein the outer shell is a conductive polymer.

14. The electrical connector assembly of claim 11, wherein the outer shell completely surrounds and completely encloses the inner core such that the inner core is not exposed at the exterior of the conductive polymer column.

15. The electrical connector assembly of claim 11, wherein the inner core is formed in place on the carrier and wherein the outer shell is formed in place on the carrier over the inner core.

16. The electrical connector assembly of claim 11, wherein the carrier openings include primary carrier openings and secondary carrier openings, the inner cores being molded onto the carrier through the corresponding primary carrier openings, the outer shells being molded onto the carrier through the corresponding secondary carrier openings.

17. The electrical connector assembly of claim 11, wherein each outer shell includes an upper portion between the upper surface of the carrier and the upper mating interface and includes a lower portion between the lower surface of the carrier and the lower mating interface, the upper portion being frustoconical shaped, the lower portion being frustoconical shaped, and wherein each inner core includes an upper inner portion and a lower inner portion, the upper inner portion being frustoconical shaped, the lower inner portion being frustoconical shaped.

18. An electrical system comprising:

a host circuit board;

an electrical component having a component circuit board; and an electrical connector assembly electrically connected between the host circuit board and the component circuit board, the electrical connector assembly comprising:

a support frame having a frame opening, the frame opening receiving the component circuit board, the support frame positioning the component circuit board within the frame opening;

a carrier coupled to the support frame, the carrier having an upper surface and a lower surface, the lower surface facing the host circuit board, the upper surface facing the component circuit board, the carrier including a plurality of contact openings therethrough; and contacts coupled to the carrier and passing through the corresponding contact openings, each contact having a conductive polymer column extending between a upper mating interface and a lower mating interface, the upper mating interface being electrically coupled to the component circuit board, the lower mating interface being electrically coupled to the host circuit board, the conductive polymer column being compressible between the upper mating interface and the lower mating interface, the conductive polymer column including an inner core at an interior of the conductive polymer column and an outer shell at an exterior of the conductive polymer column, the outer shell surrounding and enclosing the inner core the inner core being manufactured from a first material, the outer shell being manufactured from a second material, the second material having a higher electrical conductivity than the first material, the first material having a lower compression set than the second material.

19. The electrical system of claim 18, wherein the first material of the inner core is a non-conductive polymer and wherein the second material of the outer shell is a conductive polymer.

20. The electrical system of claim 18, wherein the inner core is secured to the carrier by a first molding and wherein the outer shell is secured to the carrier by a second molding over the first molding.

\* \* \* \* \*